United States Patent
Chien et al.

(10) Patent No.: US 8,625,076 B2
(45) Date of Patent: Jan. 7, 2014

(54) WAFER EDGE EXPOSURE MODULE

(75) Inventors: Tsung-Chih Chien, Caotun Township, Nantou County (TW); Yung-Cheng Chen, Jhubei (TW); Heng-Jen Lee, Baoshan Township, Hsinchu County (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 912 days.

(21) Appl. No.: 12/702,601

(22) Filed: Feb. 9, 2010

(65) Prior Publication Data

US 2011/0194086 A1   Aug. 11, 2011

(51) Int. Cl.
G03B 27/74 (2006.01)
G03B 27/42 (2006.01)

(52) U.S. Cl.
USPC .............................................. 355/68; 355/53

(58) Field of Classification Search
USPC ........................ 355/53, 67–71; 430/311, 315
See application file for complete search history.

(56) References Cited

U.S. PATENT DOCUMENTS

| | | | |
|---|---|---|---|
| 6,864,954 B2 * | 3/2005 | Suzuki | 355/53 |
| 7,088,423 B2 * | 8/2006 | Akiyama et al. | 355/53 |
| 7,277,156 B2 * | 10/2007 | Jung | 355/53 |
| 7,393,616 B2 | 7/2008 | Huang et al. | |
| 7,417,709 B2 * | 8/2008 | Lee et al. | 355/53 |
| 7,901,854 B2 * | 3/2011 | Huang et al. | 430/30 |
| 2007/0264594 A1 | 11/2007 | Chang et al. | |
| 2008/0003510 A1 | 1/2008 | Harazaki | |
| 2009/0206057 A1 | 8/2009 | Huang et al. | |

OTHER PUBLICATIONS

Official Action issued Jun. 19, 2013, in counterpart Taiwan patent application.

* cited by examiner

Primary Examiner — Hung Henry Nguyen
(74) Attorney, Agent, or Firm — Duane Morris LLP

(57) ABSTRACT

A wafer edge exposure module connected to a semiconductor wafer track system. The wafer edge exposure module includes a wafer spin device, an optical system, a scanner interface module, and a controller. The wafer spin device supports a wafer for processing. The optical system directs exposure light on a respective edge portion of the wafer simultaneously to create a dummy track on the edge of the wafer. The scanner interface module sends and/or receives dummy edge exposure information from a scanner via a computer network. The controller receives the dummy edge exposure information from the scanner interface module and uses the exposure information to control the optical system.

15 Claims, 4 Drawing Sheets

WAFER EDGE EXPOSURE MODULE

FIELD OF THE INVENTION

Aspects of the present invention relate to semiconductor processing. More specifically, the embodiments relate to a method and system to reduce scanner exposure time and improve semiconductor manufacturing throughput.

BACKGROUND INFORMATION

Semiconductor processing involves deposition, patterning and removal of various layers of materials on semiconductor wafers.

A typical semiconductor processing method 1000 is shown in FIG. 1. Usually, wafers are processed in a track-like setup (often referred to as the "wafer track") that integrates several instruments needed to process photo resist. Frequently, after deposition of a photo resist layer, block 1002, it is necessary to planarize the deposited layer using chemical mechanical polishing (CMP). CMP involves abrasion of the layer with a polishing pad, in the presence of a slurry. Following the completion of the CMP, the slurry debris and contaminants must be removed to avoid contamination of integrated circuit layers. After the photo resist deposition, the wafer is removed from the wafer track and is placed in a scanner.

The scanner is a projection-printing tool whereby an image of a mask is projected onto the wafer. The image of the mask is projected onto the wafer, exposing the main field of the wafer, block 1004. Following the main field exposure, the edge of the wafer is exposed in a wafer edge exposure (WEE) unit, forming an edge sealing ring, block 1006.

Scanner exposure time is often a time limiting factor in many semiconductor processing methods.

After scanner exposure is completed, the wafer is then returned to the wafer track for pattern developing, block 1008.

SUMMARY

A wafer edge exposure module connects to and is part of a semiconductor wafer track system. The wafer edge exposure module comprises a wafer spin device, an optical system, a scanner interface module, and a controller. The wafer spin device supports a wafer for processing. The optical system directs exposure light on a respective edge portion of the wafer simultaneously to create a dummy track on the edge of the wafer. The scanner interface module sends and/or receives dummy edge exposure information from a scanner via a computer network. The controller receives the dummy edge exposure information from the scanner interface module and uses the exposure information to control the optical system.

DETAILED DESCRIPTION

Figure 1:
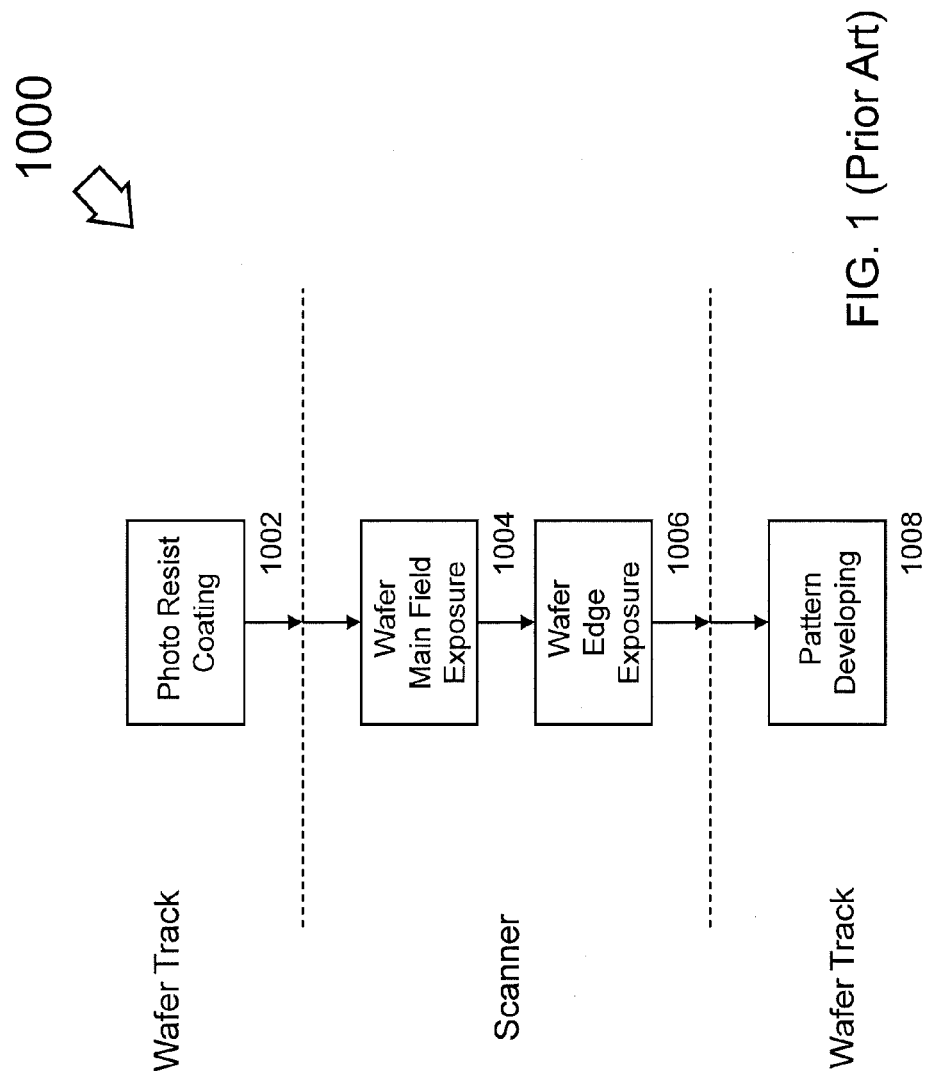
FIG. 1 depicts a typical semiconductor processing method of the prior art.

This detailed description of exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

One aspect of the present invention is the realization that for line and space layers, wafer edge exposure reduces scanner exposure time and improves throughput. Since scanner exposure time is often a time limiting factor, reducing scanner exposure time results in higher throughput.

An embodiment provides for a wafer track with a wafer edge exposure module.

Figure 2:
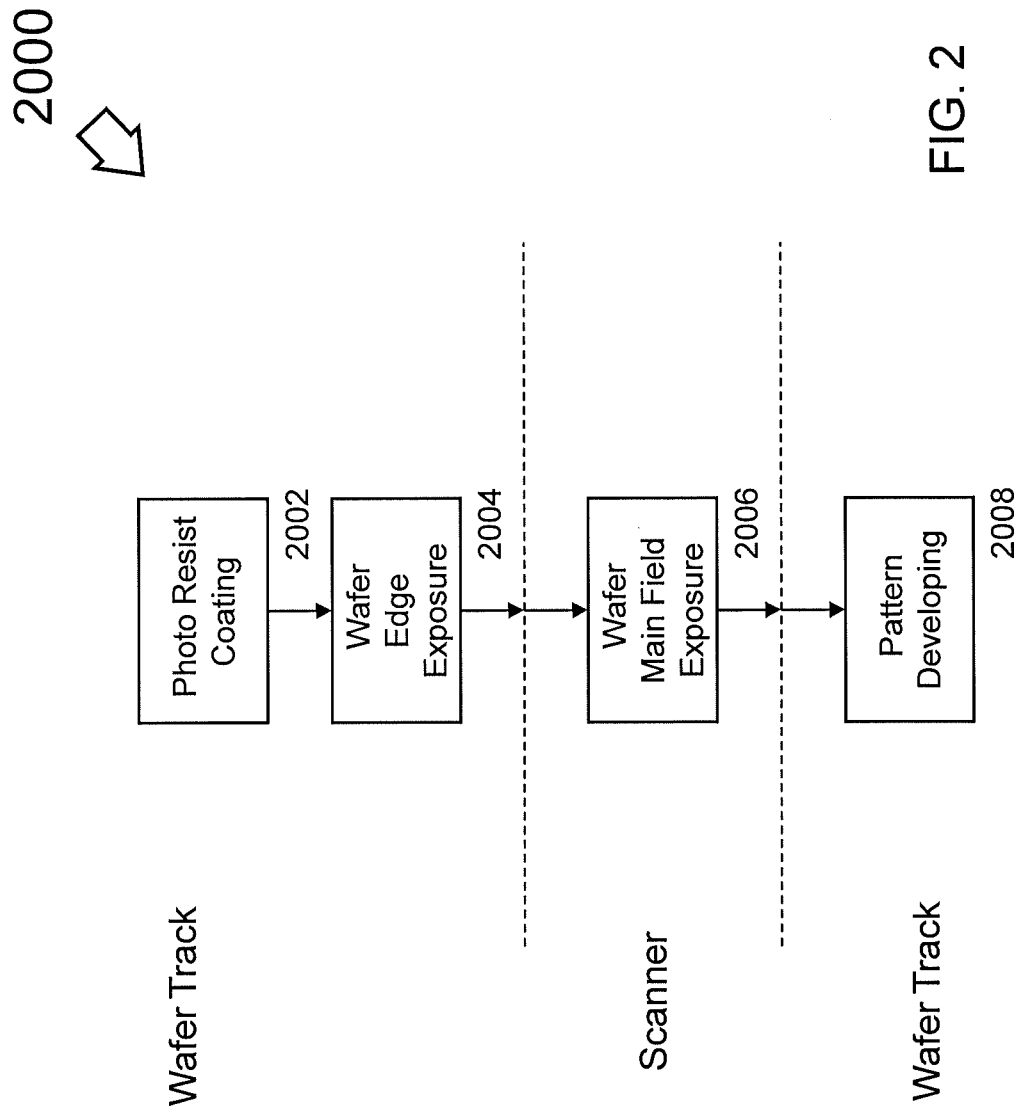
FIG. 2 illustrates a semiconductor processing method wherein wafer edge exposure is performed within the wafer track.

FIG. 2 illustrates a semiconductor processing method 2000 wherein wafer edge exposure is performed within the wafer track, in accordance with an embodiment of the present invention. Initially, the wafer is processed through the wafer track, where photo resist is applied, block 2002. Wafer edge exposure is performed within the wafer track, block 2004, which enables pipelining of the wafer processing, as edge exposure of another wafer in the wafer edge exposure module may be performed in parallel with scanning the main field of a first wafer in the scanner. Since the edges of the wafer will not be processed into the final integrated circuit, the wafer edge exposure module creates a dummy pattern.

Transferring the wafer to the scanner, the main field pattern is exposed, block 2006, and the wafer is returned to the wafer track for pattern developing, block 2008.

Figure 3:
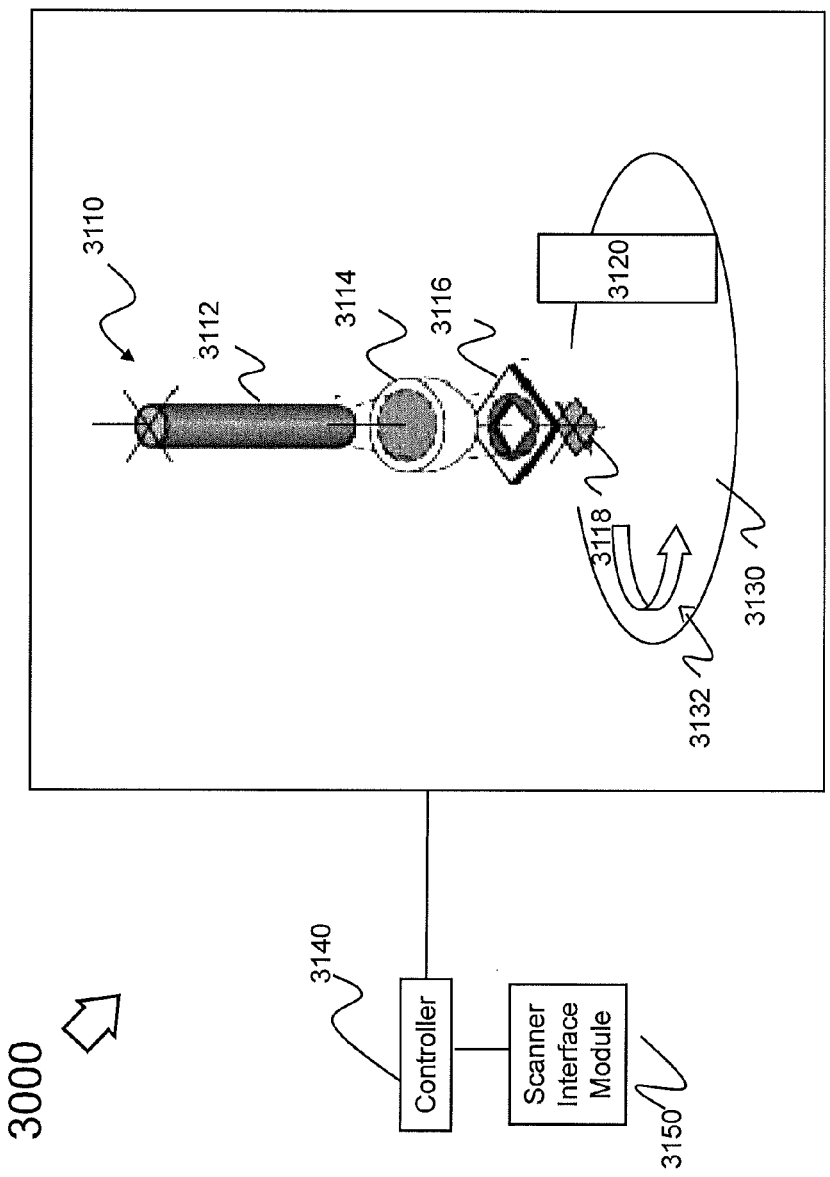
FIG. 3 is a schematic diagram of a wafer edge exposure module embedded within a wafer track.

FIG. 3 illustrates a wafer edge exposure module 3000 as part of the wafer track, in accordance with an embodiment of the present invention.

Wafer edge exposure module 3000 has a chuck for supporting a wafer 3130. The chuck rotates around a central axis.

Wafer edge exposure module 3000 comprises a wafer spin device and optical system, which includes a broadband optical system 3110, a focusing lens 3114, and exposure mask 3116. Additionally, in some embodiments wafer edge exposure module 3000 may also include a controller 3140, and a scanner interface module 3150. In some embodiments, a notch sensor is used for wafer alignment in wafer edge exposure module 3000; in such embodiments, a notch searching unit 3120 may be provided.

Optical system 3110 is shown. It is understood that more than one optical system 3110 may be used. In some embodiments, optical system 3110 has crystal optics. Optical system 3110 a respective irradiation system positioned or movably positionable with a common radial distance from the axis of the wafer spinning device. Each optical system 3110 is configured to direct exposure light on a respective edge portion of the wafer 3130 simultaneously.

In some embodiments, each optical system 3110 includes a respective light emitter, such as a laser or light emitting diode (LED), a focusing lens 3114 and an exposure mask 3116. The exposure mask 3116 permits a shaped exposure light 3118 to impinge on and develop a photosensitive material at the circumferential edge of the wafer 3130.

In some embodiments, optical system 3110 may include a plurality of light sources positioned or movably positionable directly opposite from each other along a line segment that passes through the axis.

Figure 4:
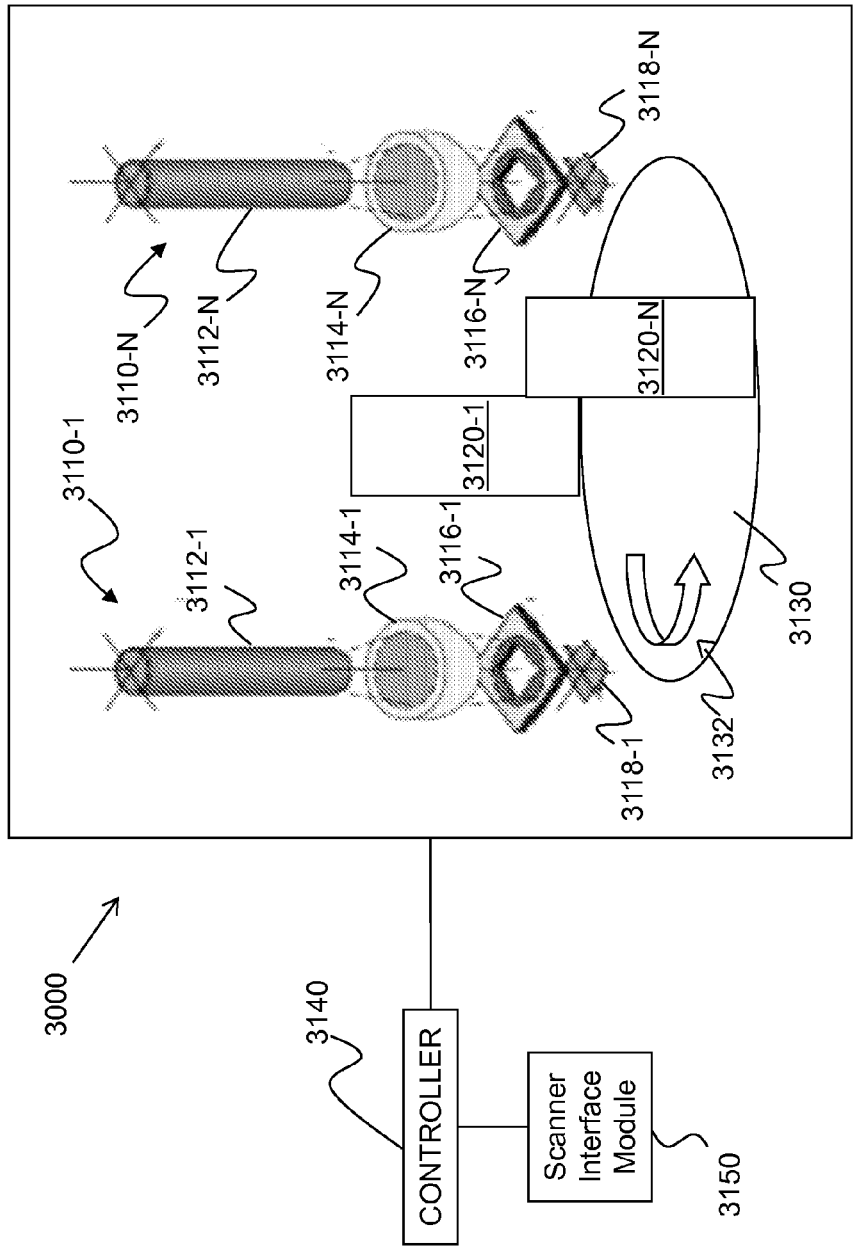
FIG. 4 is a schematic diagram of a wafer edge exposure module embedded within a wafer track including a number, N, light sources in accordance with some embodiments.

In other embodiments, such as the embodiment illustrated in FIG. 4, wafer edge exposure module 3000 may include any whole number of two or more light sources 3112-1, . . . 3112-N. More generally, the optical system includes N light sources, where N is an integer greater than one, the N light sources being spaced apart from each other by an angle of 360/N degrees between each pair of successive light sources. Thus, the wafer edge exposure module 3000 may include three light sources spaced 120 degrees apart, four light sources spaced 90 degrees apart, or any other combination. The optimal number of light sources for a given wafer edge exposure module 3000 depends on the size of the wafers to be processed, and the desired total exposure time.

For example, in an embodiment with an optical system 3110 with two light sources on opposite sides of the wafer 3130, each light source exposes a respective semi-circular half of the circumference of the edge of wafer 3130, simultaneously. When the wafer 3130 has rotated 180 degrees, the entire circumference has been exposed. Without changing the photosensitive material, irradiating light intensity, or rotation speed, the exposure time within the wafer edge exposure module 3000 is reduced by 50%.

In some embodiments, the wafer edge exposure module 3000 is originally constructed to include two light sources. In other embodiments, a second light source 110b is retro-fitted in a pre-existing wafer edge exposure module 3000.

Wafer edge exposure module 3000 may also include one or more notch searching units 3120, positioned or movably positionable for detecting a notch 3132 proximate an edge portion of the wafer 3130. For example, a plurality of notch searching units include two notch searching units positioned or movably positionable directly opposite from each other along a line segment that passes through the axis.

As shown, in a wafer edge exposure module 3000 having only one notch searching unit, if the notch has just passed the detector when the wafer begins rotating, then the first notch detection does not occur until the wafer has rotated nearly 360 degrees. Then the wafer rotates another 360 degrees before the exposure is considered complete. Thus, with only one notch searching unit, the maximum time for two detections of the notch is nearly two times the rotation period of the wafer. Similarly, the minimum time for two notch detections (when the notch passes the detector immediately after the wafer begins rotating) is slightly more than the rotation period of the wafer.

Each notch searching unit 3120 includes a light source a lens and a sensor, which may be a CCD or CMOS imaging sensor. Each notch searching unit may be mounted on a rail and movable by a linear actuator towards or away from the axis, to accommodate differently sized wafers. Upon mounting the wafer 3130 on the chuck, the notch searching units are actuated towards the axis, until the CCD or CMOS imaging sensor detects an edge of the wafer. At that point, the wafer can be rotated until the notch 3132 is detected twice, to expose the edge to the light from the light sources.

Although FIG. 3 shows a notch searching units 3120 evenly spaced from the optical system 3110, this is only an example. The notch searching units 3120 may be positioned closer to, or further from the optical system 3110, so long as the units fit within the wafer edge exposure module 3000 housing and do not interfere with each other.

More generally, the plurality of notch searching units may include N notch searching units, where N is any integer greater than one, the N notch searching units being spaced apart from each other by an angle of 360/N degrees between each pair of successive notch searching units.

With two notch searching units 3120 the amount of time between notch detections is decreased. The determination of the duration of the exposure of the wafer is based on notch detections by both notch searching units. In the embodiment of FIG. 3, the controller 3140, described below, controls the system to expose the wafer edge for a period that includes two consecutive wafer detections, one by each notch searching unit.

With an embodiment with two notch searching units 3120, if the notch 3132 has just passed the notch searching unit 3120 when the wafer 3130 begins rotating, then the first notch detection does not occur until the wafer 3130 has rotated nearly 180 degrees. Then the wafer rotates another 180 degrees before the exposure is considered complete. Thus, the maximum time for two detections of notch 3132 is reduced to less than one rotation period of the wafer. Similarly, the minimum time for two notch detections (when the notch passes the notch searching unit 3120 immediately after the wafer 3130 begins rotating) is slightly more than one half the rotation period of the wafer 3130. For larger wafers, the reduction in total wafer edge exposure module 3000 time of about one rotation period is a significant time savings that may improve the duty cycle of the downstream equipment.

With two notch detection units 3120, the controller 3140 controls the duration of the wafer edge exposure process, so as to include detections of the notch by each of the two notch searching units 3120. More generally, with N notch detection units, the controller 3140 controls the duration of the wafer edge exposure process, so as to include detections of the notch by two successive ones of the N notch searching units. The controller 3140 controls the duration to be shorter than a period of three successive detections of the notch by three successive ones of N evenly spaced notch searching units. Further, it is not necessary to wait for any single one of the notch detection units to make a second detection by the same notch detection unit to complete the exposure of the wafer.

The controller 3140 may be an embedded microprocessor or digital signal processor implemented in application specific integrated circuitry (ASIC), or a networked computer or programmable logic controller. Controller 3140 controls the system to expose the wafer edge, while communicating with a scanner via scanner interface module 3150.

Scanner interface module 3150 is any electronic device capable of communicating processing data with a scanner. In some embodiments, scanner interface module 3150 may be any interface as known in the art for communicating or transferring files across a computer network, examples of such networks include Transmission Control Protocol/Internet Protocol (TCP/IP), Ethernet, Fiber Distributed Data Interface (FDDI), token bus, or token ring networks.

Coordinating processing information with the scanner, controller 3140 calculates and forwards dummy shot coordinates to the scanner to facilitate the main field of a wafer. Scanner interface module 3150 sends the coordinates of the dummy shot to the wafer edge exposure module 3000 via a controller. The dummy shot may be located via a notch sensor used for wafer alignment.

In the foregoing specification, the aspects have been described with reference to specific embodiments thereof. It will, however, be evident that various modifications and changes may be made thereunto without departing from the broader spirit and scope as set forth in the appended claims. The specification and drawings are accordingly to be regarded in an illustrative rather than in a restrictive sense.

What is claimed is:

1. A wafer edge exposure module configured to connect to a semiconductor wafer track system, comprising:
   a wafer spin device configured to support a wafer, the wafer coated with a photosensitive material;
   an optical system configured to direct exposure light on a respective edge portion of the wafer;
   a scanner interface module configured to send or receive dummy edge exposure information from a scanner via a computer network;
   a controller configured to control the optical system using the dummy edge exposure information from the scanner;
   a light source configured to emit the direct exposure light;
   a focusing lens configured to focus the direct exposure light received from the light source; and
   an exposure mask configured to shape the direct exposure light to impinge on an develop the photosensitive material at the circumferential edge of the wafer,
   wherein the optical system includes N light sources, where N is an integer greater than one, the N light source spaced apart from each other by an angle of approximately 360/N degrees between each pair of successive light sources.

2. The wafer edge exposure module of claim 1, further comprising:
   a plurality of notch searching units positioned or movably positionable for detecting a notch proximate an edge portion of the wafer.

3. The wafer edge exposure module of claim 2, wherein the plurality of notch searching units includes two notch searching units positioned or movably positionable directly opposite from each other along a line segment that passes through the axis.

4. The wafer edge exposure module of claim 2, wherein the plurality of notch searching units includes N notch searching units, where N is an integer greater than one, the N notch searching units being spaced apart from each other by an angle of 360/N degrees between each pair of successive notch searching units.

5. The wafer edge exposure module of claim 4, further comprising a controller for controlling a duration of the wafer edge exposure process, so as to include detections of the notch by at least two successive ones of the plurality of notch searching units.

6. The wafer edge exposure module of claim 1, wherein:
   the optical system includes N light sources, where N is an integer greater than one, the N light sources being spaced apart from each other by an angle of 360/N degrees between each pair of successive light sources, and
   the wafer edge exposure module further comprises N notch searching units positioned or movably positionable for detecting a notch proximate an edge portion of the wafer, the N notch searching units being spaced apart from each other by an angle of 360/N degrees between each pair of successive notch searching units.

7. The wafer edge exposure module of claim 6, further comprising a controller for controlling a duration of the wafer edge exposure process, so as to include detections of the notch by at least two successive ones of the plurality of notch searching units.

8. A wafer edge exposure method for a semiconductor wafer track system, comprising:
   supporting a wafer with a wafer spin device;
   coating the wafer a photosensitive material;
   exposing direct light an on a respective edge portion of the wafer with an optical system, the optical system further comprising:
      a number of light sources configured to emit the direct exposure light simultaneously, where the number is an integer greater than one, the number light sources being spaced apart from each other by an angle of 360/number degrees between each pair of successive light sources;
      a focusing lens configured to focus the direct exposure light received from the light sources;
      an exposure mask configured to shape the direct exposure light to impinge on and develop the photosensitive material at the circumferential edge of the wafer;
   sending or receiving dummy edge exposure information from a scanner via a computer network; and
   controlling the optical system using the dummy edge exposure information from the scanner.

9. The wafer edge exposure method of claim 8, further comprising:
   detecting a notch proximate an edge portion of the wafer with a plurality of notch searching units positioned or movably positionable.

10. The wafer edge exposure method of claim 9, wherein the plurality of notch searching units includes three notch searching units positioned or movably positionable directly opposite from each other along a line segment that passes through the axis.

11. The wafer edge exposure method of claim 10, wherein the plurality of notch searching units includes three notch searching units, the three notch searching units being spaced apart from each other by an angle of 120 degrees between each pair of successive notch searching units.

12. The wafer edge exposure module of claim 1, wherein the controller is configured to control the optical system of the wafer edge exposure module in response to receiving dummy edge exposure information from the scanner.

13. A wafer edge exposure module configured to connect to a semiconductor wafer track system, comprising:
   a wafer spin device configured to support a wafer, the wafer coated with a photosensitive material;
   an optical system configured to direct exposure light on a respective edge portion of the wafer;
   a scanner interface module configured to send or receive dummy edge exposure information from a scanner via a computer network;
   a controller configured to control the optical system using the dummy edge exposure information from the scanner; and
   a plurality of notch searching units positioned or movably positionable for detecting a notch proximate an edge portion of the wafer,
   wherein the plurality of notch searching units includes N notch searching units, where N is an integer greater than one, the N notch searching units being spaced apart from each other by an angle of 360/N degrees between each pair of successive notch searching units.

14. The wafer edge exposure module of claim 13, wherein the controller is configured to control a duration of the wafer edge exposure process, so as to include detections of the notch by at least two successive ones of the plurality of notch searching units.

15. The wafer edge exposure module of claim 13, further comprising:
   a focusing lens configured to focus the direct exposure light received from the light source; and an exposure mask configured to shape the direct exposure light to impinge on an develop the photosensitive material at the circumferential edge of the wafer.

* * * * *

UNITED STATES PATENT AND TRADEMARK OFFICE
CERTIFICATE OF CORRECTION

PATENT NO. : 8,625,076 B2
APPLICATION NO. : 12/702601
DATED : January 7, 2014
INVENTOR(S) : Tsung-Chih Chien et al.

It is certified that error appears in the above-identified patent and that said Letters Patent is hereby corrected as shown below:

In the Claims

Column 5, Line 22, Claim 1, delete "source" and insert -- sources being --.

Signed and Sealed this
Fourteenth Day of October, 2014

Michelle K. Lee
*Deputy Director of the United States Patent and Trademark Office*